US008298853B2

(12) United States Patent
Adkisson et al.

(10) Patent No.: US 8,298,853 B2
(45) Date of Patent: Oct. 30, 2012

(54) CMOS PIXEL SENSOR CELLS WITH POLY SPACER TRANSFER GATES AND METHODS OF MANUFACTURE

(75) Inventors: James W. Adkisson, Jericho, VT (US); John J. Ellis-Monaghan, Grand Isle, VT (US); Rajendran Krishnasamy, Essex Juction, VT (US); Solomon Mulugeta, Essex Junction, VT (US); Charles F. Musante, South Burlington, VT (US); Richard J. Rassel, Essex Juction, VT (US)

(73) Assignee: International Business Machines Corporation, Armonk, NY (US)

( * ) Notice: Subject to any disclaimer, the term of this patent is extended or adjusted under 35 U.S.C. 154(b) by 18 days.

(21) Appl. No.: 12/853,795

(22) Filed: Aug. 10, 2010

(65) Prior Publication Data

US 2012/0037967 A1 Feb. 16, 2012

(51) Int. Cl.
*H01L 21/00* (2006.01)
(52) U.S. Cl. ................... 438/73; 257/E21.001
(58) Field of Classification Search ............ 438/57, 438/73, 488; 365/185.7; 445/1; 348/311; 345/76; 257/231, 290, 291.292, E21.001
See application file for complete search history.

(56) References Cited

U.S. PATENT DOCUMENTS

| | | | |
|---|---|---|---|
| 5,070,380 A | 12/1991 | Erhardt et al. | |
| 6,180,535 B1 | 1/2001 | Wu et al. | |
| 7,443,437 B2 | 10/2008 | Altice, Jr. et al. | |
| 7,557,024 B2 | 7/2009 | Rhodes | |
| 7,557,335 B2 | 7/2009 | Hong et al. | |
| 7,622,321 B2 | 11/2009 | Rhodes | |
| 2007/0013798 A1 | 1/2007 | Ahn et al. | |
| 2007/0267501 A1 | 11/2007 | Jovanovski et al. | |
| 2009/0184345 A1 | 7/2009 | Fan et al. | |
| 2009/0311822 A1* | 12/2009 | Adkisson et al. ............. | 438/73 |

FOREIGN PATENT DOCUMENTS

| | | |
|---|---|---|
| JP | 2004319837 | 11/2004 |
| JP | 2004357261 | 12/2004 |
| JP | 2005322996 | 11/2005 |
| JP | 2009147049 | 7/2009 |

OTHER PUBLICATIONS

Song et al., "Electrical Characterization . . . CMOS Image Pixels", Semiconductor Science and Technology, vol. 23, No. 7, 075032, Jul. 1, 2008 pp. 1-7.
IBM, "Methods and System for . . . Image Sensor", IP.com PriorArtDatabase, Feb. 2, 2010, pp. 1-4.
Lauxtermann et al., "Comparison of Global . . . Image Sensors", pp. 82-85. Paper at 2007 International Image Sensor Workshop.
Chen et al., "Simple Gate-To-Drain . . . Hot-Electron Degradation", IEEE Electron Device Letters, vol. 11, No. 2, Feb. 1990, pp. 78-81.

* cited by examiner

*Primary Examiner* — Richard A. Booth
(74) *Attorney, Agent, or Firm* — Anthony Canale; Roberts Mlotkowski Safran & Cole, P.C.

(57) ABSTRACT

CMOS pixel sensor cells with spacer transfer gates and methods of manufacture are provided herein. The method includes forming a middle gate structure on a gate dielectric. The method further includes forming insulation sidewalls on the middle gate structure. The method further includes forming spacer transfer gates on the gate dielectric on opposing sides of the middle gate, adjacent to the insulation sidewalls which isolate the middle gate structure from the spacer transfer gates. The method further includes forming a photo-diode region in electrical contact with one of the spacer transfer gates and a floating diffusion in electrical contact with another of the spacer transfer gates.

24 Claims, 6 Drawing Sheets

GS = global shutter
GT = global transfer
HG = hold gate
TG = transfer gate
RG = reset gate
RS = row select gate
SF = source follower
PD = photodiode Concentration of
electrons in photodiodes Concentration of
electrons in photodiodes

CMOS PIXEL SENSOR CELLS WITH POLY SPACER TRANSFER GATES AND METHODS OF MANUFACTURE

FIELD OF THE INVENTION

The invention relates to pixel sensor cells and methods of manufacturing and, more particularly, to CMOS pixel sensor cells with spacer transfer gates and methods of manufacture.

BACKGROUND

CMOS image sensors are beginning to replace conventional CCD sensors for applications requiring image pickup such as digital cameras, cellular phones, PDA (personal digital assistant), personal computers, and the like. Advantageously, CMOS image sensors are fabricated by applying present CMOS fabricating process for semiconductor devices such as photodiodes or the like, at low costs. Furthermore, CMOS image sensors can be operated by a single power supply so that the power consumption for that can be restrained lower than that of CCD sensors, and further, CMOS logic circuits are easily integrated in the sensor chip and therefore the CMOS image sensors can be miniaturized.

Electronic global shutter offers a number of advantages over the commonly used rolling shutter operation for CMOS image sensors. Because the light-induced signal is transferred simultaneously, the artifacts induced by image motion during the readout time of the rolling shutter readout are avoided. Unfortunately, the electronic global shutter operation introduces new challenges to the sensor. One challenge is the inability to do correlated double sampling (CDS). With correlated double sampling, the floating diffusion is reset by turning on the reset gate and this value is sampled and stored. Immediately thereafter, the charge from the photodiode is transferred to the floating diffusion and sampled. The difference between these voltage values is the net signal level from the photodiode, and reduces the noise due to variable reset gate signals and 1/f noise in the source follower in rolling shutter mode. This CDS operation is not possible with the standard 5-transistor electronic global shutter. The signal needs to be stored on the floating diffusion, so even if the reset value is stored for the length of the frame, it will not be correlated in time for each row.

To address the noise issue, 7T global shutter pixels are a promising new technology for low noise, high quality global shutter applications. For example, 7T technology can eliminate the motion artifacts inherent in rolling shutter operation, while also providing correlated double sampling in global shutter operation. The 7T pixel sensor cell works by, for example:

taking an image, allowing the photodiode to convert the photons into electron/hole pairs;
integrating over a shutter time, the collected electrons on the photodiode;
globally transferring the electrons from all the photodiodes simultaneously;
holding charge on the middle hold gate till the row can be read out; and
CDS readout from the hold gate to the floating diffusion.

However, the disadvantage of the 7T pixel sensor cell is the need for additional chip real estate to accommodate extra transistors, i.e., a total of seven transistors. This, in turn, leads to increased production costs. In addition, pixel sensor cells (e.g., CMOS imagers) can suffer added noise when the transfer of charge from the photodiode through the transfer gate is incomplete. For 7T transistors, this challenge is more significant as there are now additional transfers that must be made with near perfect efficiency. Accordingly, there exists a need in the art to overcome the deficiencies and limitations described hereinabove.

SUMMARY

In a first aspect of the invention, a method comprises forming a middle gate structure on a gate dielectric. The method further comprises forming insulation sidewalls on the middle gate structure. The method further comprises forming spacer transfer gates on the gate dielectric on opposing sides of the middle gate, adjacent to the insulation sidewalls which isolate the middle gate structure from the spacer transfer gates. The method further comprises forming a photo-diode region in electrical contact with one of the spacer transfer gates and a floating diffusion in electrical contact with another of the spacer transfer gates.

In another aspect of the invention, a method of forming a pixel sensor cell comprise forming a gate dielectric on a substrate. The substrate includes a source/drain region and a photodiode collector region. The method further comprises patterning a poly layer on the gate dielectric to form a middle gate. The method further comprises forming oxide sidewalls on the patterned middle gate. The method further comprises forming end spacers on the gate dielectric which are in direct physical contact with the oxide sidewalls. The method further comprises implanting a dopant into the end spacers to form spacer transfer gates. The method further comprises forming a photo-diode region in electrical contact with one of the spacer transfer gates and a floating diffusion in electrical contact with another of the spacer transfer gates.

In yet another aspect of the invention, a pixel sensor cell comprises at least three gates on a continuous dielectric layer. The cell comprises a global transfer gate, a hold gate and a transfer gate. The global transfer gate and the transfer gate are provided on ends of the hold gate isolated by an oxide sidewall on the hold gate. The global transfer gate and the transfer gate are formed as spacers to the hold gate. The global transfer gate is located adjacent to a photosensitive region while the transfer gate is located adjacent to a floating diffusion region.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the pixel sensor cell (PSC), which comprises the structures of the present invention. In still further embodiments, a method in a computer-aided design system is provided for generating a functional design model of the PSC. The method comprises generating a functional representation of the structural elements of the PSC.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to pixel sensor cells and methods of manufacturing and, more particularly, to CMOS pixel sensor cells with spacer transfer gates and methods of manufacture. In embodiments, the CMOS pixel sensor cells can have poly, metal or other semiconductor spacer transfer gates, which act as a global and transfer gates of a pixel sensor cell. In addition to providing high-density, the spacer transfer gates of the CMOS pixel sensor cells exhibit faster charge transfer efficiency and the advantages of correlated double sampling (CDS) readout, as well as low readout noise to maximize light sensitivity and lower image lag.

The CMOS pixel sensor cells can be implemented in a high chip-density 7T (transistor) global shutter pixel having transfer gates with smaller dimensions (than conventional systems) that permit closer placement of devices thereby increasing the density of pixels on a chip. The increased pixel density increases charge transfer efficiency, fill factor, and improves image resolution.

More specifically, the present invention is directed to pixel sensor cells, exhibiting high-density and lower lag. The pixel sensor cells are created with three gates: a gate electrode comprising a main gate region formed from heavily doped polysilicon and sidewall spacer transfer gates which are also formed from doped polysilicon, or other semiconductor material such as Ge or metal alongside the middle gate. Silicon nitride, high dielectric constant material or other dielectric materials can be used under the spacer transfer gates to improve the Ioff characteristics of the spacer transfer gates. In embodiments, the pixel sensor cells of the present invention utilize a global shutter operation mode which is important for high-speed video applications by eliminating motion blur.

Figure 1:
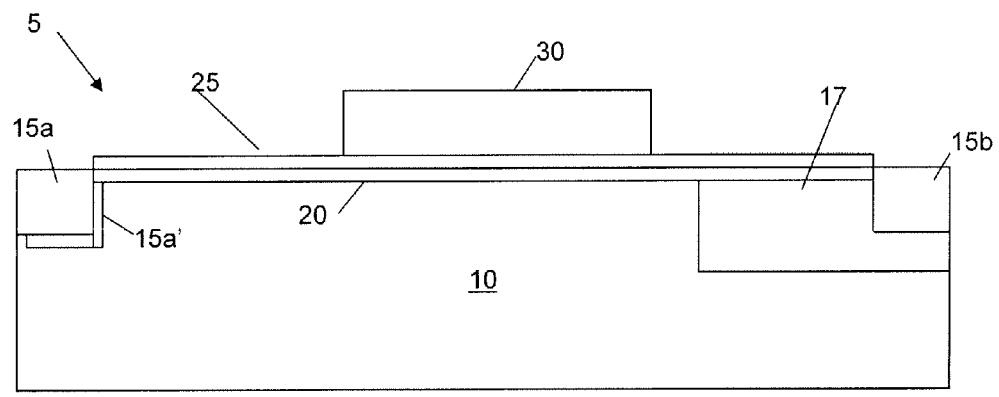
FIGS. 1-4 show structures and fabrication processes in accordance with an aspect of the invention.

FIG. 1 shows an intermediate structure and respective processing steps in accordance with aspects of the present invention. The structure of FIG. 1 represents the middle gate, e.g., hold gate. In particular, the structure 5 starts with a p-type doped silicon wafer with a p-epi layer 10, which acts as a collection region. Isolation regions 15 are formed in the wafer 10 using conventional lithographic and etching processes. For example, a resist is placed on the wafer 10, and exposed to light to form a pattern corresponding to the isolation regions. Trenches are then formed in the wafer 10 using conventional etching techniques such as, for example, reactive ion etching (RIE). The trenches are filled with oxide, for example, in an STI process, to form the isolation regions 15a and 15b. In embodiments, a doped region 15a' can be formed under the isolation region 15a for passivation. In further embodiments, the isolation region 15b can be formed in a conventionally formed p-well 17.

Still referring to FIG. 1, the wafer 10 can be implanted with, for example, a p-type implant, e.g., boron, to form a transfer gate threshold region 20. The transfer gate threshold region 20 can extend to the isolation regions 15 or be more limited to under a gate region, depending on the design requirements. The transfer gate threshold region 20 will have a higher implant concentration than the wafer 5. The lower doped concentration of the wafer acts as a collect charge region. In embodiments, the implant of the transfer gate threshold region 20 will set the threshold transfer of the transfer gate. In embodiments, the transfer gate threshold region 20 can be tuned for different thresholds.

A gate dielectric 25 is deposited on the wafer, between the isolation regions 15. The gate dielectric 25 is deposited using a conventional thermal oxidation process. A poly layer is deposited and patterned on the gate dielectric 25 using conventional processes to form a poly gate (middle gate) 30 on the gate dielectric 25. The middle gate serves as a hold gate in a pixel sensor cell. Also, the middle gate structure 30 serves as a middle gate region (hold gate) of the gate electrode for a three transfer-gate formation of the present invention.

Figure 2:
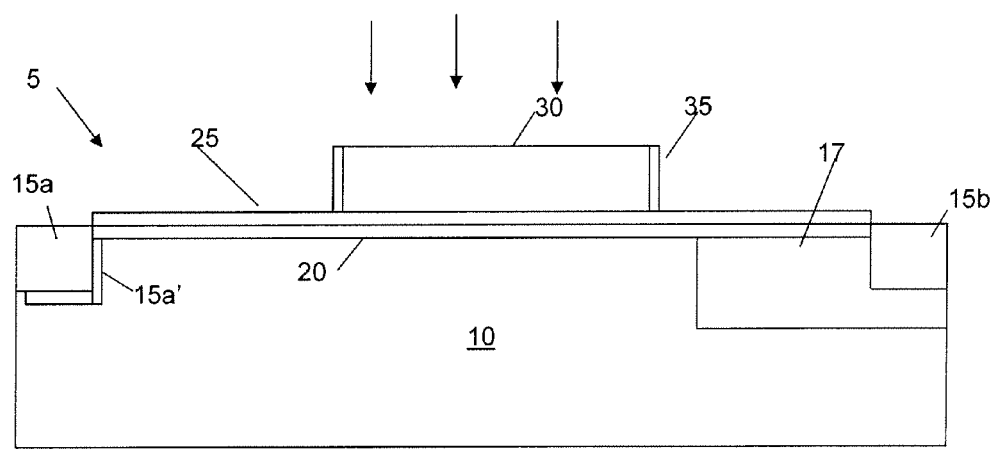

As shown in FIG. 2, the middle gate structure 30 (or hold gate) undergoes a slight oxidation process. More specifically, the middle gate structure 30 undergoes an oxidation process in dry oxygen to form oxide sidewall spacers 35. In embodiments, the sidewall spacer 35 is about 1000 Å wide, and provides an isolation between the middle gate and end gate transfer gates (shown in FIG. 3). The oxidation process also mends the exposed gate oxide during gate etch. In further embodiments, an anisotropic etch process selectively removes the first sidewall material from over the middle gate structure 30 and from an outer portion of the source/drain region 40, leaving the spacer 35 along the lateral side of the gate structure 30. A dielectric is then grown or deposited to serve as the capacitor for the spacer transfer gates.

Figure 3:
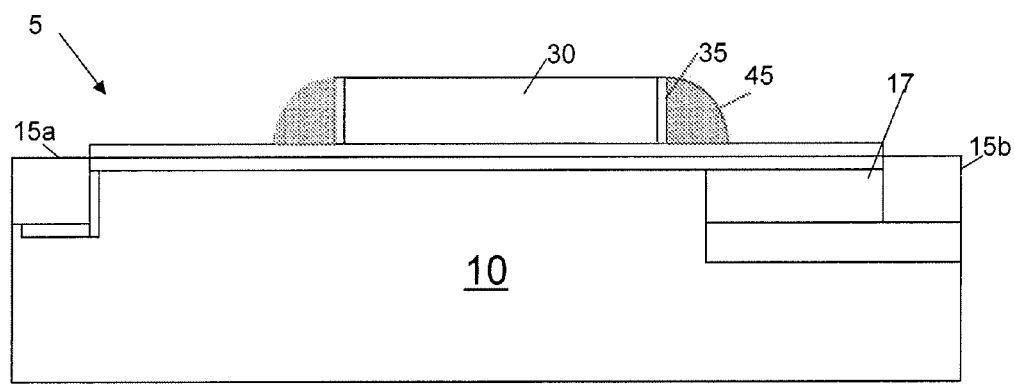

FIG. 3 shows the beginning formation of the spacer transfer gates in accordance with aspects of the invention. In FIG. 3, poly sidewall spacers 45 (e.g., which will form transfer gates on the sides of the middle gate 30) are formed in direct physical contact with the oxide sidewalls 35 (and underlying gate dielectric 25, which may be a continuous dielectric layer under all of the gates discussed herein). In embodiments, an anisotropic etch process selectively removes the spacer material from over the middle gate structure 30 and from part of the outer portion of the source/drain region 40, leaving the spacer along the lateral side of the first sidewall spacer 35.

In embodiments, the sidewall spacers 45 (referred hereinafter as spacer transfer gates) act as the first and third gates of the three-transfer-gate transistor, which are isolated from the middle gate structure 30 by the oxide sidewalls 35. The spacer transfer gates 45 can be a global transfer gate and a transfer gate; whereas, the middle gate structure 30 can be a hold gate.

As discussed herein, the spacer transfer gates 45 can be formed from other semiconductor material such as Ge or metal alongside the middle gate 30. In embodiments, the gate dielectric 25 under the spacer transfer gates 45 can have a different thickness than under the middle gate structure 30. In further embodiments, the gate dielectric 25 can be different materials such as, for example, silicon nitride, high dielectric constant material or other dielectric materials to improve the Ioff characteristics of the spacer transfer gates 45. As further examples, the gate dielectric 25 can be $SiO_2$, oxynitride or a high-k stack such as, for example, $HfO_2$, Hf Silicate, etc, with the bottom layer being, for example, $SiO_2$. The gate dielectric 25 can have a thickness of about 5 nm to about 50 nm. The spacer transfer gates 45 can be a width of about 0.12 µm to 0.25 µm.

Figure 4:
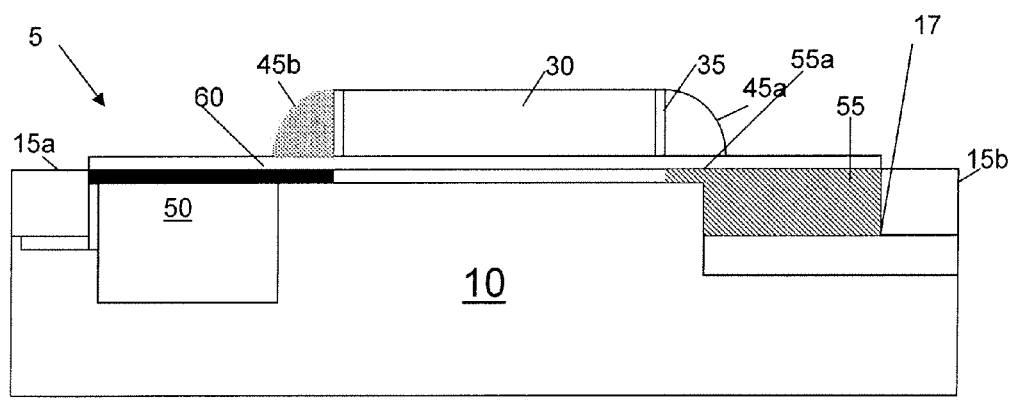

In FIG. 4, the wafer receives an n-type photodiode implant to form an n-photodiode region 50, followed by an n-type source drain implant to form a floating diffusion region 55 in the p well 17. The structure also undergoes a p-type pinning layer implant to form a very shallow implant region 60 above the n-photodiode region 50. In embodiments, the n-type source drain implant will form an n-type transfer gate 45a and the p-type pinning layer implant will form a p-type transfer gate 45b. In embodiments, the very shallow implant region 60 can extend slightly under the transfer gate 45b. In embodiments, the transfer gates 45a, 45b can also be predoped. It should as be understood by those of skill in the art that the regions not being doped, can be protected by a hardmask, for example.

In embodiments, the n-type photodiode implant is a lightly doped n-type implant such as, for example, phosphorous, arsenic or antimony. In embodiments, the n-photodiode region 50 is self aligning and is provided at a depth of about 2000 Å to 3000 Å; although, other depths are also contemplated by the present invention. The dose of the implant can be about $1 \times 10e^{12}$ cm$^2$ to $4 \times 10e^{12}$ cm$^2$, for example. The n-type source drain implant (to form a floating diffusion region 55) can be provided at a dosage of about $1 \times 10e^{13}$ cm$^2$ to $1 \times 10e^{15}$ cm$^2$. A tail region 55a of the floating diffusion region can be formed overlapping the poly transfer gate 45a, and can be, for example, phosphorous, arsenic or antimony, and can be fanned at a dosage of about $1 \times 10e^{12}$ cm$^2$ to $1 \times 10e^{1}$ cm$^2$. In this way, the spacer transfer gate 45b is located in direct physical and electrical contact with the floating diffusion region 55.

The p-type pinning layer implant to form a very shallow implant region 60 can be formed at an energy of about 1 to 20 Kev, and can have a depth of about less than 1000 Å. The p-type pinning layer implant can be a p-type implant such as, for example, boron or indium. The pinning layer 60 and the n-photodiode 50 are arranged in such a way that the spacer transfer gate 45b is in good electrical contact with the n-photodiode region when the spacer transfer gate is turned on. The pixel sensor cell is essentially complete at this stage, and conventional processing methods may be used to form insulating, shielding, and metallization layers to connect gate lines and other connections to the pixel sensor.

In embodiments, it should be well understood that the present invention can also be implemented using an n type wafer. For example, in this alternative embodiment, the wafer 10 can be implanted with, for example, an n-type implant to form an n-type transfer gate threshold region 20. The wafer can then receive a p-type photodiode implant to form a p-photodiode region 50, followed by a p-type implant to form a p type floating diffusion region 55. The structure can undergo an n-type pinning layer implant to form a very shallow implant region 60 above the p-photodiode region 50. In embodiments, the p-type implant will form a p-type transfer gate 45a and the n-type pinning layer implant will form an n-type transfer gate 45b.

Figure 5:
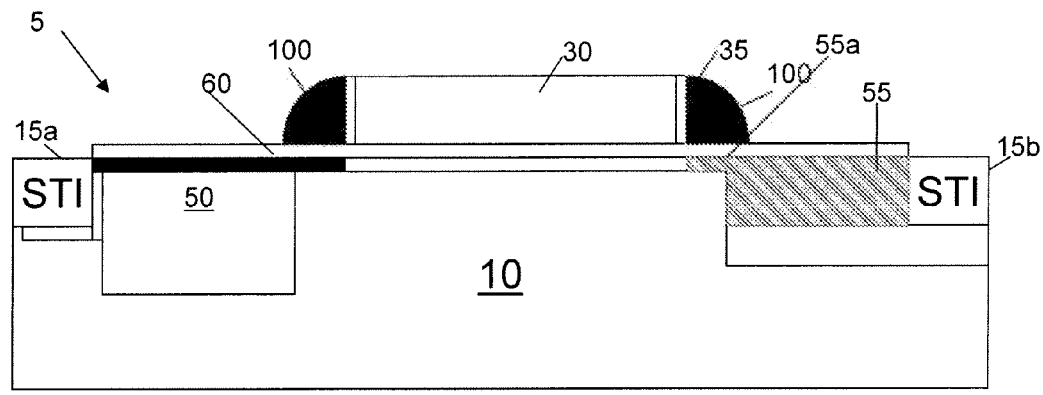
FIG. 5 shows a structure and fabrication processes in accordance with an aspect of the invention.

FIG. 5 represents an alternative embodiment of the spacer transfer gates in accordance with aspects of the invention. The device of FIG. 5 can be fabricated using the processes described herein. In particular, the embodiment of FIG. 5 shows metal spacer transfer gates 100 that are isolated from the middle gate 30 by oxide sidewalls 35. In this implementation, the metal can be deposited using conventional processes such as, for example, CVD or other metal deposition processes, for example. The metal spacer transfer gates 100 can be, for example, tungsten or aluminum, which may have lower resistance than other spacer transfer gate materials discussed herein. In embodiments, the work function of the metal and threshold tailor implants can be adjusted in order to lower lag. Replicating the poly spacer device would require proper choice of metal and changes in the substrate doping to compensate for any work function difference. The transfer gates 45 can be a width of about 0.12 µm to 0.25 µm.

Figure 6:
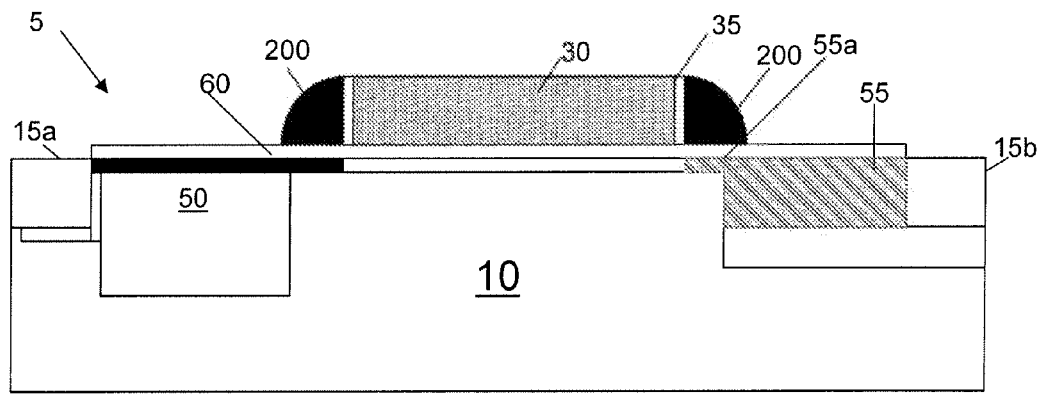
FIG. 6 shows a structure and fabrication processes in accordance with an aspect of the invention.

FIG. 6 represents an alternative embodiment of the spacer transfer gates in accordance with aspects of the invention. The device of FIG. 6 can be fabricated using the processes described herein. In particular, FIG. 6 shows a p-type implant for both the spacer transfer gates 200. This will form two p-type transfer gates 200 on a side of an n-type middle gate 30, isolated by oxide sidewalls 35. The p-type transfer gates 200 can be doped while blocking the middle gate 30, and the middle gate 30 can be doped while blocking the spacer transfer gates 200. The transfer gates 45 can be a width of about 0.12 µm to 0.25 µm.

Figure 7:
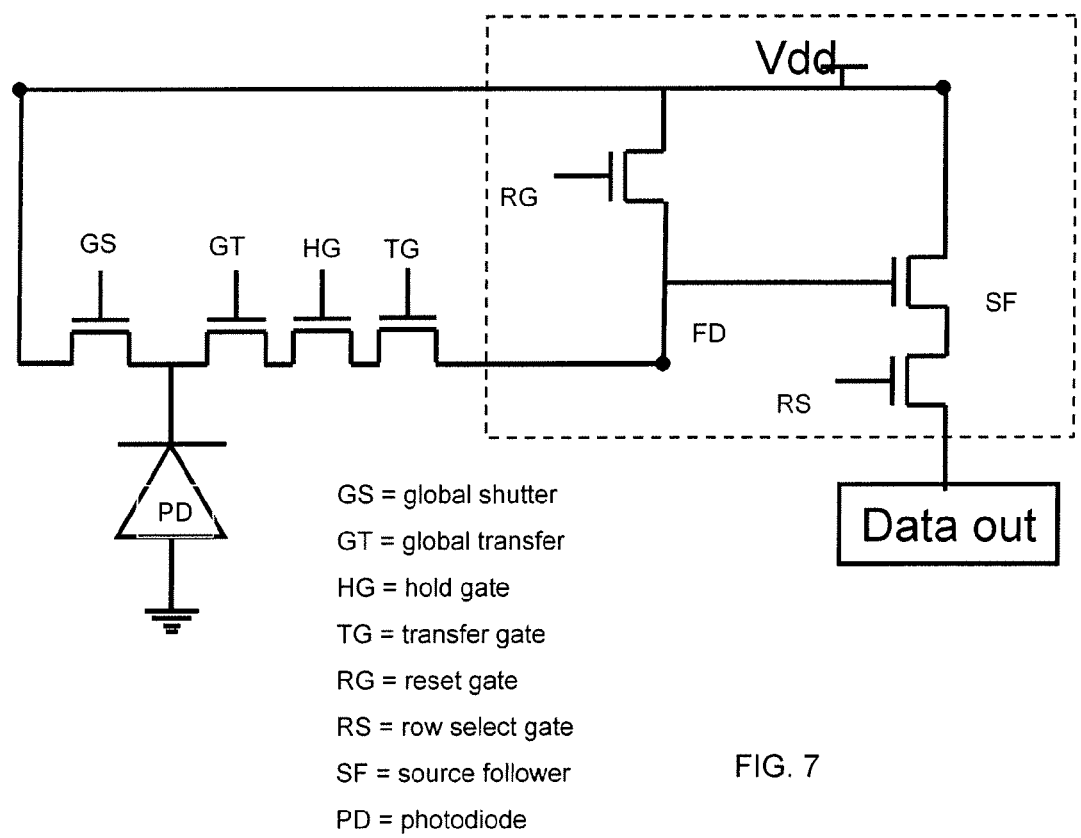
FIG. 7 shows a schematic diagram of a 7T global pixel sensor cell implementing any of the aspects of the invention.

FIG. 7 shows a schematic of a pixel sensor cell implementing aspects of the present invention. In particular, FIG. 7 shows a 7T pixel sensor cell implementing aspects of the present invention. It should be understood by those of skill in the art that the pixel sensor cell shown in FIG. 7 can be implemented with any of the aspects of the present invention. As shown in FIG. 7, the pixel sensor cell includes a photodiode PD electrically connected with a global shutter GS (which clears out the electrons), as well as a global transfer GT, hold gate HG and transfer gate GT, in series. In embodiments, the transfer gates of the present invention server as the global transfer gate GT and the transfer gate TG; whereas, the middle gate will serve as the hold gate. Connected to Vdd is a reset gate RG. It should be well understood that independent power supplies rather than a singe Vdd might be preferred depending on the application and space constraints. The pixel sensor cell also includes a row select gate RS and a source following SF leading to data out.

Figure 8A:
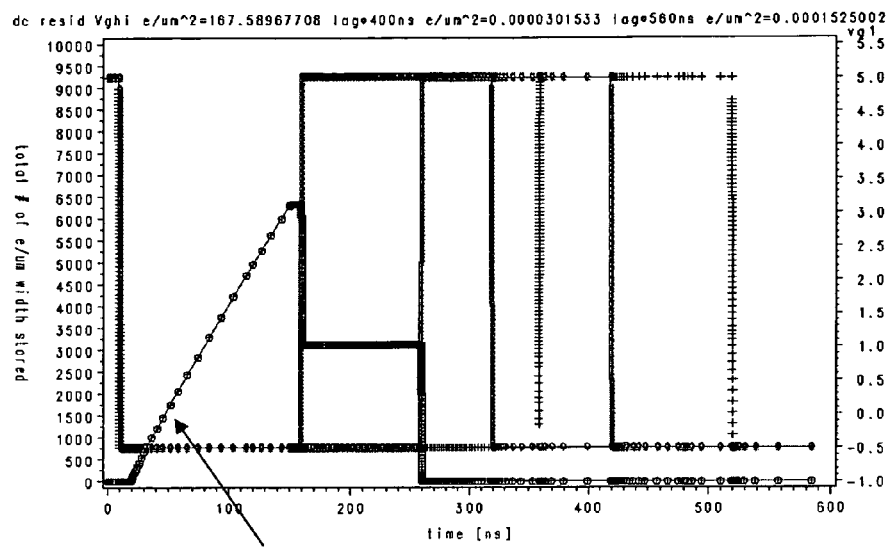
FIGS. 8a-8b show simulation results implementing the aspects of the invention.
Figure 8B:
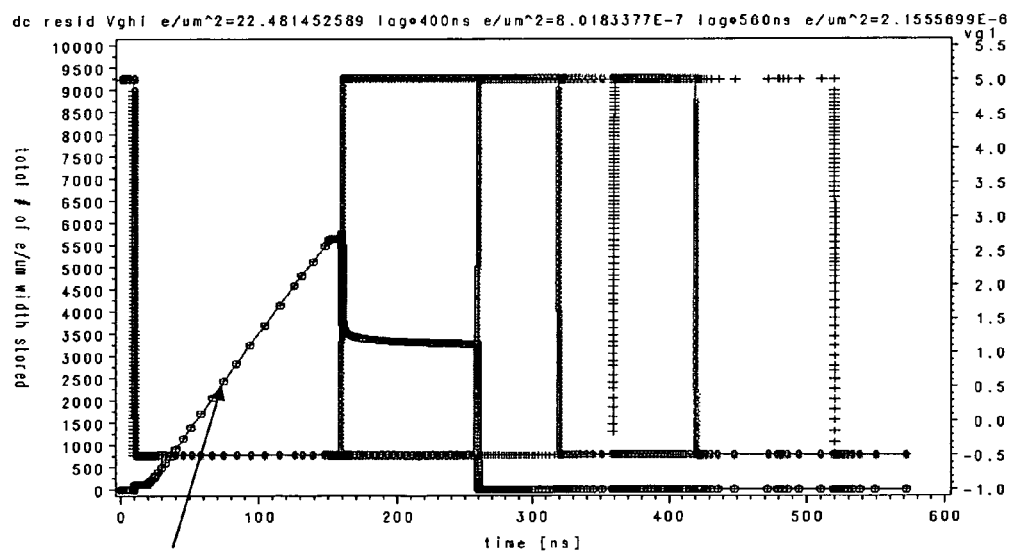

FIGS. 8a-8b show simulation results using the aspects of the invention as described herein. The simulation results of FIGS. 8a-8b are graphs of time (x axis) vs. total electrons (y axis). FIG. 8a shows simulation results for a poly spacer transfer gate. FIG. 8b shows simulation results for a n-type middle gate with p type spacer transfer gate. The simulations shown in FIGS. 8a-8b show a build up of the concentration of electrons in the photodiode and, clearing of the electrons. FIGS. 8a and 8b show successful device designs where essentially no electrons are left in the photodiode after full transfer to the floating diffusion (t>400 ns). Different metals and well doping is required to make the transfer complete.

Figure 9:
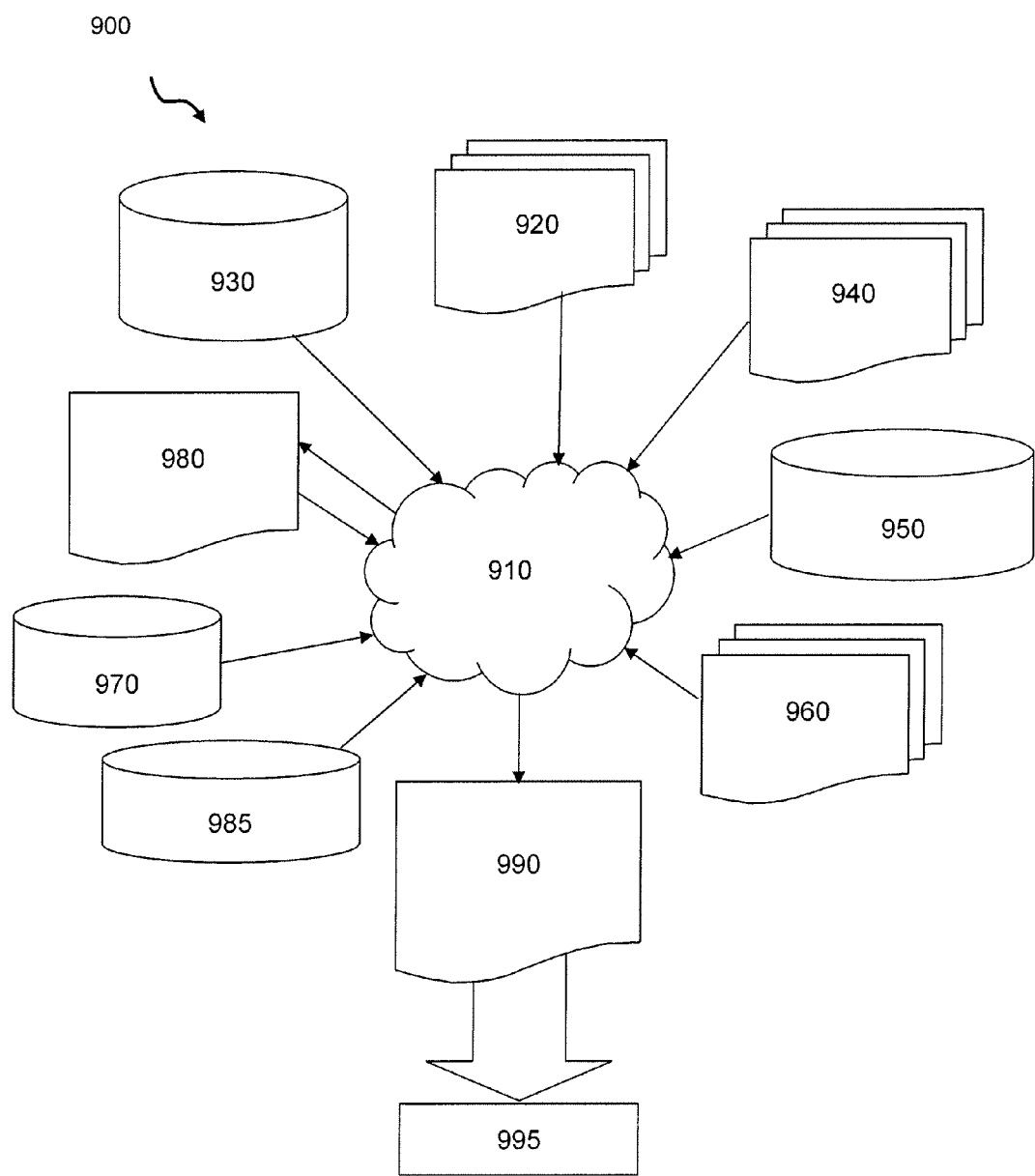
FIG. 9 is a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-7. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-7 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-7. In one embodiment, design structure 990 may comprise a compiled, executable HDL simulation model that functionally simulates the devices shown in FIGS. 1-7.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-7. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method, comprising:
   forming a middle gate structure on a gate dielectric;
   forming insulation sidewalls on the middle gate structure;
   forming spacer transfer gates on the gate dielectric on opposing sides of the middle gate, adjacent to the insulation sidewalls which isolate the middle gate structure from the spacer transfer gates; and
   forming a photo-diode region in electrical contact with one of the spacer transfer gates and a floating diffusion in electrical contact with another of the spacer transfer gates.

2. The method of claim 1, wherein the spacer transfer gates are formed from a poly deposition on the insulation sidewalls.

3. The method of claim 2, wherein the one spacer transfer gate is p doped and the another spacer transfer gate is n doped.

4. The method of claim 2, wherein the one spacer transfer gate and the another spacer transfer gate are p doped and the middle gate structure is n doped.

5. The method of claim 1, wherein the spacer transfer gates are metal gates formed by a metal deposition process.

6. The method of claim 1, wherein the middle gate structure and the spacer transfer gates are formed from separate poly deposition processes, separated by an oxide layer formed by a dry oxidation process.

7. The method of claim 1, wherein the dielectric layer is formed with a different thickness under the middle gate structure than the spacer transfer gates.

8. The method of claim 1, wherein the spacer transfer gates are formed from Ge or a Si—Ge alloy.

9. The method of claim 1, wherein the dielectric layer under the spacer transfer gates is one of silicon nitride, $SiO_2$, oxide, oxynitride and a gate dielectric including hafnium.

10. The method of claim 1, wherein the dielectric layer is formed to a thickness of about 5 nm to about 50 nm under the spacer transfer gates.

11. The method of claim 1, wherein the spacer transfer gates have a width of about 0.12 μm to 0.25 μm.

12. A method of forming a pixel sensor cell, comprising:
    forming a gate dielectric on a substrate, the substrate including a source/drain region and a photodiode collector region;
    patterning a poly layer on the gate dielectric to form a middle gate;
    forming oxide sidewalls on the patterned middle gate;
    forming end spacers on the gate dielectric which are in direct physical contact with the oxide sidewalls;
    implanting a dopant into the end spacers to form spacer transfer gates; and
    forming a photo-diode region in electrical contact with one of the spacer transfer gates and a floating diffusion in electrical contact with another of the spacer transfer gates.

13. The method of claim 12, wherein the spacer transfer gates are formed from a poly deposition on the oxide sidewalls.

14. The method of claim 12, wherein the spacer transfer gates are doped with a p type dopant and an n type dopant.

15. The method of claim 12, wherein the spacer transfer gates are doped during the formation of a diffusion region and the floating diffusion.

16. The method of claim 12, wherein the spacer transfer gates are doped with a p type dopant and the patterned middle gate is doped with an n type dopant.

17. The method of claim 12, wherein the spacer transfer gates are metal gates formed by a metal deposition process.

18. The method of claim 12, wherein the gate dielectric is formed with a different thickness under the middle gate structure than the spacer transfer gates.

19. The method of claim 12, wherein the spacer transfer gates have a width of about 0.12 μm to 0.25 μm.

20. A pixel sensor cell comprising:
    at least three gates on a continuous dielectric layer, comprising a global transfer gate, a hold gate and a transfer gate, wherein:
    the global transfer gate and the transfer gate are provided on ends of the hold gate isolated by an oxide sidewall on the hold gate,
    the global transfer gate and the transfer gate are formed as spacers to the hold gate,
    the global transfer gate is located adjacent to a photosensitive region while the transfer gate is located adjacent to a floating diffusion region,
    the global transfer gate and the transfer gate are in direct contact with the oxide sidewall on the hold gate,
    the global transfer gate and the transfer gate are the spacers of the hold gate in direct physical contact with the oxide sidewalls, and
    the global transfer gate and the transfer gate are isolated from the hold gate by the oxide sidewall on the hold gate;
    a shallow implant region provided under the continuous dielectric layer and extending under the global transfer gate; and
    a floating gate diffusion formed partially under the transfer gate.

21. A design structure tangibly embodied in a machine readable medium for designing, manufacturing, or testing an integrated circuit, the design structure comprising:
- at least three gates on a continuous dielectric layer, comprising a global transfer gate, a hold gate and a transfer gate, wherein:
  - the global transfer gate and the transfer gate are provided on ends of the hold gate isolated by an oxide sidewall on the hold gate,
  - the global transfer gate and the transfer gate are formed as spacers to the hold gate,
  - the global transfer gate is located adjacent to a photosensitive region while the transfer gate is located adjacent to a floating diffusion region
  - the global transfer gate and the transfer gate are in direct contact with the oxide sidewall on the hold gate,
  - the global transfer gate and the transfer gate are the spacers of the hold gate in direct physical contact with the oxide sidewalls, and
  - the global transfer gate and the transfer gate are isolated from the hold gate by the oxide sidewall on the hold gate;
- a shallow implant region provided under the continuous dielectric layer and extending under the global transfer gate; and
- a floating gate diffusion formed partially under the transfer gate.

22. The design structure of claim 21, wherein the design structure comprises a netlist.

23. The design structure of claim 21, wherein the design structure resides on storage medium as a data format used for the exchange of layout data of integrated circuits.

24. The design structure of claim 21, wherein the design structure resides in a programmable gate array.

* * * * *